(12) United States Patent
Kessel

(10) Patent No.: US 7,576,289 B2
(45) Date of Patent: Aug. 18, 2009

(54) ELECTROMAGNETIC SHIELDING

(76) Inventor: Wolfgang Kessel, Am Bargfeld 15, D-22941 Bargteheide (DE)

( * ) Notice: Subject to any disclaimer, the term of this patent is extended or adjusted under 35 U.S.C. 154(b) by 215 days.

(21) Appl. No.: 11/383,779

(22) Filed: May 17, 2006

(65) Prior Publication Data

US 2007/0084631 A1   Apr. 19, 2007

(30) Foreign Application Priority Data

May 17, 2005   (DE)   ............... 10 2005 023 344

(51) Int. Cl.
*H01R 4/00*   (2006.01)
*H01R 4/56*   (2006.01)
*H05K 9/00*   (2006.01)

(52) U.S. Cl. .................. 174/372; 174/363; 174/392

(58) Field of Classification Search .............. 174/388, 174/392, 393, 363, 372, 373; 52/579, 588.1; 361/816, 818, 800
See application file for complete search history.

(56) References Cited

U.S. PATENT DOCUMENTS

| 1,697,142 | A | * | 1/1929 | Roller | 336/234 |
|---|---|---|---|---|---|
| 2,838,592 | A | * | 6/1958 | Feketics | 174/371 |
| 3,217,085 | A | * | 11/1965 | Lindgren | 174/371 |
| 3,334,175 | A | * | 8/1967 | Vincent | 174/367 |
| 3,340,587 | A | * | 9/1967 | Beyer | 29/897.3 |
| 3,783,174 | A | * | 1/1974 | Lindgren | 174/373 |
| 4,068,087 | A | * | 1/1978 | Ristig | 174/367 |
| 4,733,013 | A | * | 3/1988 | Hemming | 174/373 |
| 4,823,523 | A | * | 4/1989 | Coupard et al. | 52/3 |
| 4,965,408 | A | * | 10/1990 | Chapman et al. | 174/363 |
| 5,028,740 | A | * | 7/1991 | Tomiya | 174/373 |
| 5,210,373 | A | * | 5/1993 | Weber | 174/363 |
| 5,367,123 | A | * | 11/1994 | Plummer et al. | 174/36 |
| 5,402,323 | A | * | 3/1995 | Schwenk et al. | 361/816 |
| 5,532,427 | A | * | 7/1996 | Stoyko | 174/363 |
| 5,595,801 | A | * | 1/1997 | Fahy et al. | 428/40.1 |
| 5,656,795 | A | * | 8/1997 | Miska | 174/356 |
| 5,796,033 | A | * | 8/1998 | Stoyko | 174/363 |
| 6,054,647 | A | * | 4/2000 | Ridener | 174/392 |

FOREIGN PATENT DOCUMENTS

| DE | 37 81 272 T2 | 2/1993 |
|---|---|---|
| DE | 196 48 544 A1 | 5/1998 |
| DE | 299 23 709 U1 | 6/2001 |
| GB | 2 234 636 A | 2/1991 |

* cited by examiner

*Primary Examiner*—Hung V Ngo
(74) *Attorney, Agent, or Firm*—Panitch Schwarze Belisario & Nadel LLP

(57) ABSTRACT

An electromagnetic shield is provided for a room or for a building, including overlapping, conductively connected, and electrically conductive mesh or grid sections (1-4). The sections are grounded and folded in the overlapping area, where the folds of adjacent mesh or grid sections (1, 2) interlock like hooks in a cross section view.

14 Claims, 4 Drawing Sheets

19

ELECTROMAGNETIC SHIELDING

BACKGROUND OF THE INVENTION

The invention relates to an electromagnetic shield for a room or for a building.

Known electromagnetic shields are intended to block electromagnetic waves, which are typically used for wireless radio communication, from buildings or parts of buildings, and on the other hand they are used to assure that electromagnetic radiation from a room or from a building does not get outside. Typically, they are not suited to protect technical installations like nuclear power plants from a nuclear electromagnetic pulse (NEMP) or from another electromagnetic pulse with high amplitude (HEMP—high altitude electro magnetic pulse). Such an electromagnetic pulse typically occurs when a nuclear chain reaction is set off in the air, e.g. when an atomic or hydrogen bomb is exploded at ground level, but also through targeted punctual generation (HPM—high power microwave). The electromagnetic radiation generated thereby is strong enough to disturb or destroy all electronic circuits in a large surrounding area through the induction of high currents in the circuits. In order to protect important technical installations or critical process controls, as are typically found in nuclear power plants, against failure, e.g. due to an electromagnetic nuclear pulse, no practical electromagnetic shields are known to accomplish this. The problem occurs in particular, when, for example, existing nuclear power plants have to be retrofitted with such electromagnetic shields.

From German Patent DE 37 81 272 T2 it is known to electromagnetically shield a building by covering the side walls with plates with metal grids inside, wherein the grids of neighboring plates are electrically connected and grounded. The shield described therein, however, is not suitable at all to dampen the nuclear electromagnetic pulse (NEMP) of a nuclear chain reaction sufficiently for the electronic components inside the shield to survive without being damaged. This, however, is not the goal and purpose of the shield described therein. Its purpose is to shield against electromagnetic radiation, as is typically generated by radio signals, from the inside out and from the outside in.

From German published patent application DE 196 48 544 A1 a shield against electromagnetic radiation is known, comprising a multitude of overlapping, electrically conductive and electrically connected mesh, grid, or foil sections. These sections are overlapping, and there is no electric insulation in the overlapping area, where they are glued together to establish an electrical connection. The glue joints have proven to be problematic, since it is generally not possible to assure the required, well conducting electrical connection over the whole length of the overlapping sections. Where there is no connection, or an insufficient connection of the sections, the efficiency of the shield is more or less restricted and thereby insufficient.

BRIEF SUMMARY OF THE INVENTION

With this background in mind an objective of the present invention is to provide an electromagnetic shield for a room or for a building, which provides strong damping over wide frequency bands, as required, e.g. by MIL-STD 188-125 Part 1 and 2, and in particular to reliably shield, e.g. a nuclear power plant, against NEMP or against HEMP or HPM, wherein the shield can also be retrofitted to existing buildings.

The electromagnetic shield according to the invention can serve a single room or a whole building and comprises overlapping, conductively connected and electrically conductive mesh or grid sections, which are grounded. The mesh sections are folded in the overlapping area, wherein the folds of adjacent mesh or grid sections interlock like hooks, which are visible in a cross sectional view.

The mesh or grid sections of the present invention comprise structures made from conductive rods or wires, which are assembled into a tightly meshed grid or net structure, wherein conductive connections are formed in the crossover points through material connection or through contact.

It is advantageous in particular to have the overlapping areas of adjacent mesh or grid sections extend over the whole length and width, since a quasi tight grid is formed around the room or building to be shielded, which has virtually homogenous electric conductivity.

The formed mesh or grid is made of metal, preferably stainless steel, copper or a copper alloy. When using stainless steel there is a reduced damping due to its significantly lower conductivity compared to copper. However, the use of stainless steel will be sufficient for applications, where protection against NEMP of a nuclear reaction does not have to be provided. The use of stainless steel has the advantage that working it is comparatively simple and that a surface application is possible outside the finish, e.g. between the wall and the insulation, without having a detrimental effect on the long-term stability of the shield. Furthermore, when integrated into the structure of the building, the mesh can be used as reinforcement.

In order to achieve optimum damping characteristics, it is useful to employ mesh or grid sections made of copper that is as pure as possible. However, for long-term stability it is better to embed the overlapping and conductively connected mesh or grid sections into a solidifying or hardening layer like a finish or into a layer of epoxy resin. Preferably, the copper is alloyed by up to 3% with an oxidation generator, such as tin, aluminum or nickel. The oxidation, however, does not noticeably influence conductivity.

In order to keep the contact area (overlapping area) stable long-term, it is useful to fix it through compression or interlocking, if possible, which can be accomplished through a suitable mechanical connection. Here, metal staples have proven useful for connecting the mesh or grid sections through compression and interlocking. The staples can comprise copper or copper plated metal, when using copper meshes. It is understood that when other materials, such as stainless steel, are used, the staples can also be made from the same material. There, the staples are positioned in the area of overlapping folds with a suitable spacing along the whole overlapping length and width, establishing an additional mechanical connection.

In order to fix the assembled shield and stabilize it long-term, it is preferably embedded into a layer of finish, screed or bitumen, which can be provided on the inside of a room or on the outside of a building. Preferably, finish or filler is used, which does not contain oxidants and which has a medium particle size smaller than the mesh size of the mesh or grid sections, in order to assure a strong connection between the finish or screed layer and the embedded mesh or grid sections, on the one hand, and the wall to be connected therewith, on the other hand. The encasement with bitumen is preferably used for applications where there is contact with the ground soil.

As mentioned above, when the shield is located between the wall and the insulation layer, it is useful to connect the insulation layer with plastic anchors within the wall, which reach through the mesh or grid sections. The holes in the mesh or grid sections created hereby reduce the damping/absorption only insignificantly. The plastic anchors avoid the antenna effect associated with metal anchors.

In order to achieve high absorption through electrical shorting, on the one hand, and high reflection, on the other hand, it is useful to provide the mesh or grid sections with a mesh size between 0.1 mm and 1 mm. The diameter of the wire should be between 0.05 mm and 0.5 mm. It is preferred, in particular, to make the mesh sections from copper wire, which is as pure as possible and has a diameter of 0.13 mm to 0.15 mm and a mesh size of 0.35 mm to 0.4 mm. The damping of the shield provided thereby can be additionally increased by superimposing two or more shields, electrically connected among each other and grounded.

Particular for shielding underground areas of a foundation, it can be useful to employ grid or mesh sections with a mesh size of up to 1 cm and with a wire diameter of up to 5 mm.

When an existing building, like a nuclear reactor, has to be retrofitted with a shield according to the invention, as far as the exposed outer part of the building is concerned, this can be accomplished by embedding a shield in the outer finish or by integration into elements of the facade or the roof. Retrofitting a shield to the outside area of the foundation is practically not possible. In such cases, an interior ground shield is applied, which is extended upwards into the wall area, providing an overlapping inside and outside shield in the wall area, electrically connected by a multitude of conductors. Through this overlap between inside and outside shield, a practically closed shield can be provided.

The basic idea of the present invention is not only to connect electrically conductive mesh or grid sections in an electrically conductive manner, e.g. via cables, but to arrange the mesh or grid sections so they overlap and connect along their entire length and width with adjacent sections. In order to assure good electric connection in the overlapping area, possibly along the entire length of the overlap, the mesh or grid section according to the invention is folded in the overlapping area. The edges are folded by 180°, whereby the folds of neighboring mesh or grid sections are arranged so they interlock like hooks, which are visible in a cross sectional view. Not only quadruple overlaps are created thereby in the overlapping area, but open pockets are also created, where a respective fold of the neighboring mesh or grid section engages, so it is contacted from both sides. A multitude of contact points between the single mesh and grid sections is thereby created, which create a quasi homogenous web around the room or around the building, which provides for a high frequency proof and homogenously conductive shield made from single pieces, wherein the induced currents are shorted, so a damping effect can be created with adequate dimensioning, that is strong enough to conduct away the electromagnetic pulse (NEMP) of a nuclear chain reaction in a safe manner.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
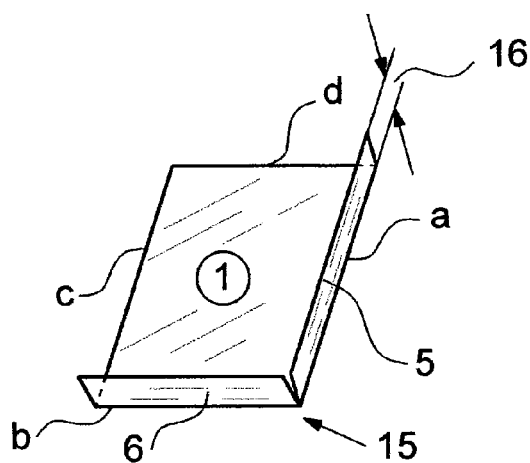
FIG. 1 through FIG. 10 are perspective plan views showing procedural steps of how to assemble a shield according to the invention from a multitude of adjacent mesh or grid sections.
Figure 2:
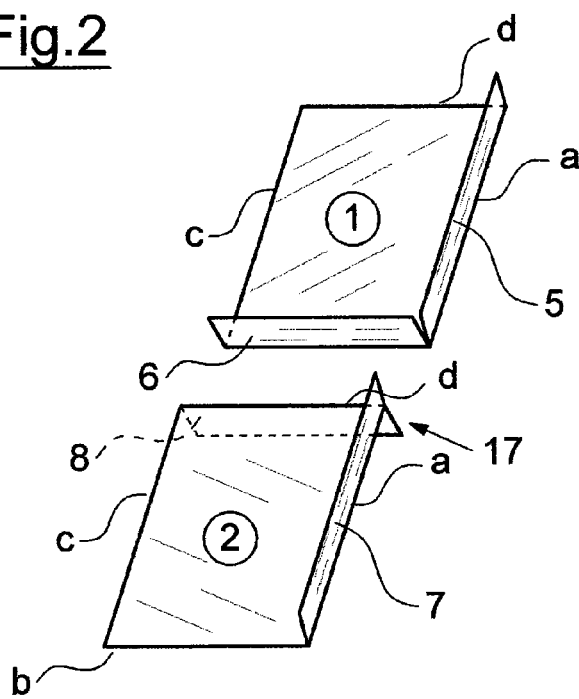

The basic configuration of a shield for a room or for a building is not shown in the drawing in detail. It consists of a multitude of mesh and grid sections 1-4, which are connected in an overlapping and conductive manner as shown in the drawings. They form a mesh or grid and completely surround the room or the building from all sides, from the ceiling, from the ground, and they are grounded at least in one point, preferably in many points.

In the area of doors and windows care must taken that the grid or mesh structure is realized in a similar manner, whereby in particular the tight and conductive alignment of the surfaces moveable relative to each other, typically the contact areas of window and door folds, is important. Here, the shield can be provided on the inside or on the outside or on both sides. For rooms the shield is preferably provided on the inside, for buildings the shield is preferably provided on the outside.

The basic configuration of a shield made from grid or mesh sections is explained subsequently. In the embodiments shown in the Figures, rectangular sections of copper wire mesh are used, wherein the copper wire has a diameter of 0.14 mm and the mesh has a size of 0.375 mm.

A first mesh section 1 with rectangular shape is folded along a longitudinal side (a) and along a lateral side (b). First, in the area 15, where the longitudinal side (a) and the lateral side (b) meet, and where the fold will subsequently be created, a rectangular piece corresponding to the width 16 of the fold is removed. Thereafter, the material is folded upward by 90° in order to form a longitudinal fold 5 and a lateral fold 6 from the peripheral areas of the mesh section 1, which protrude upward by 90° relative to the other material.

The mesh section 1, treated as above, is mounted to the wall, to the ceiling or to the ground. Thereafter, a second mesh section 2, also made from rectangular sheet material is cut out in its perimeter area at the corner 17, formed between the sides (a) and (b), which are then folded. There, in the area of the longitudinal side (a) a fold 7 is folded upward by 90° and in the area of the lateral side (d) a fold 8 is folded downward by 90°.

Figure 3:
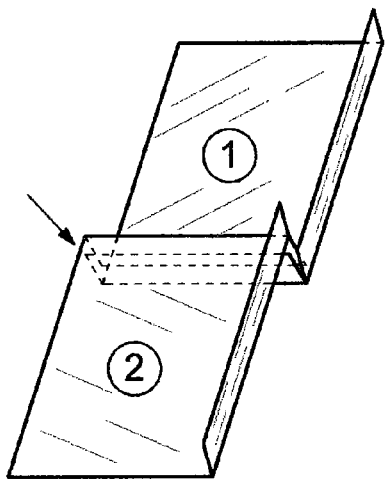

The fold 8 is then positioned behind the fold 6 of the mesh section 1, so the folds 5 and 7 are located in one plane and the folds 6 and 8 abut each other, reaching over each other, as shown in FIG. 3.

Figure 4:
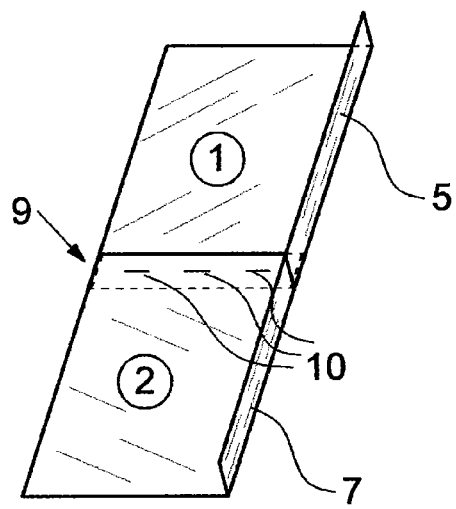

The folds 6 and 8 are then folded further, by 180° relative to the respective base material, so they lock into each other like two hooks in cross section, forming a quadruple overlap in this area. This overlapping area 9 is then fixed with staples 10, reaching through three to four layers (depending on the stapler) of the mesh, durably and reliably connecting them. The staples 10 are positioned at suitable, not too large distances adjacent each other, as can be seen in FIG. 4. The folds 5 and 7 line up to form a joint fold in the part consisting of the two mesh sections 1 and 2.

Figure 5:
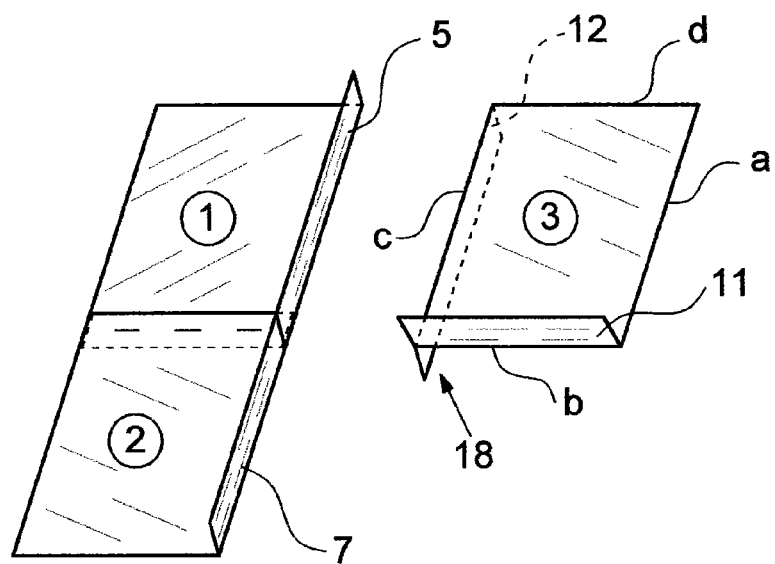
Figure 6:
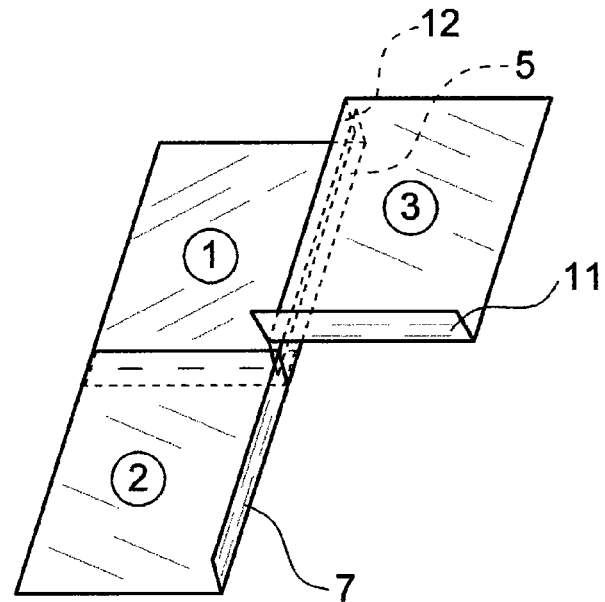

Now, another mesh section 3 is prepared, which is cut out in the perimeter area 18 between its lateral side (b) and its longitudinal side (c). Thereafter, the perimeter area of the side (b) is folded upward by 90° into a fold 11 and the perimeter area of the side (c) is folded downward by 90° into a fold 12, as shown in FIG. 5.

The mesh section 3 is then, with its downward protruding fold 12, laid over the upward protruding fold 5 of the mesh section 1, so the two folds 5 and 12 abut each other, whereby the fold 5 abuts the bottom of the mesh section 3 with its upper edge and the fold 12 abuts the upper side of the mesh section 1 with its lower edge. In this position, which is shown in FIG.

Figure 7:
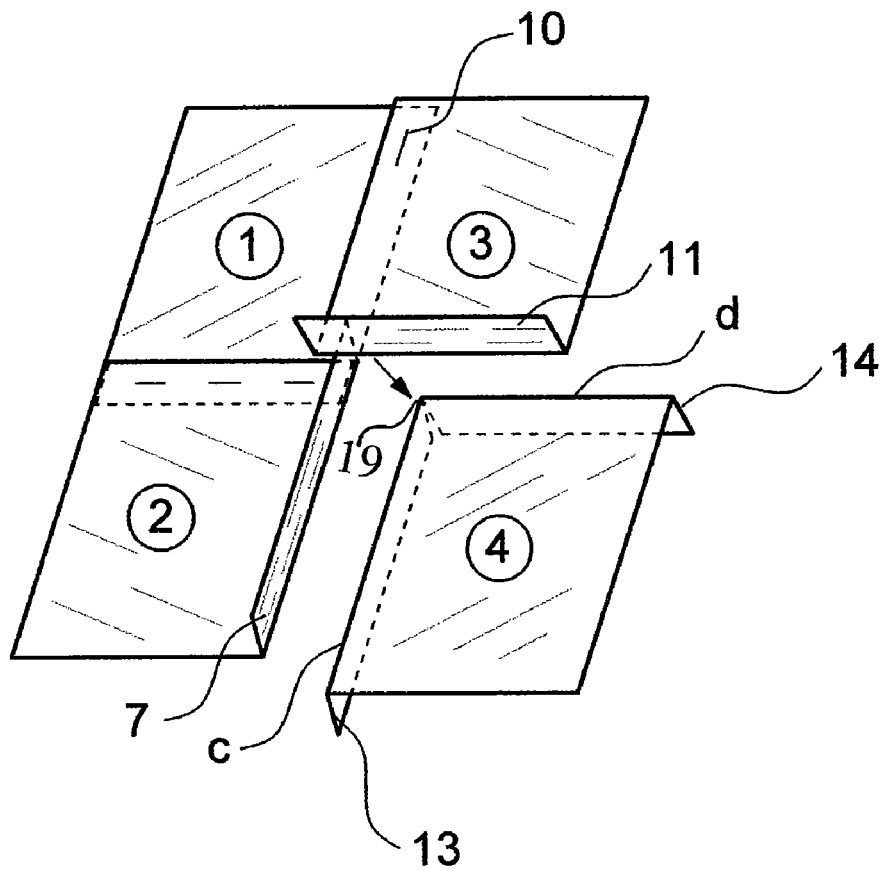
Figure 8:
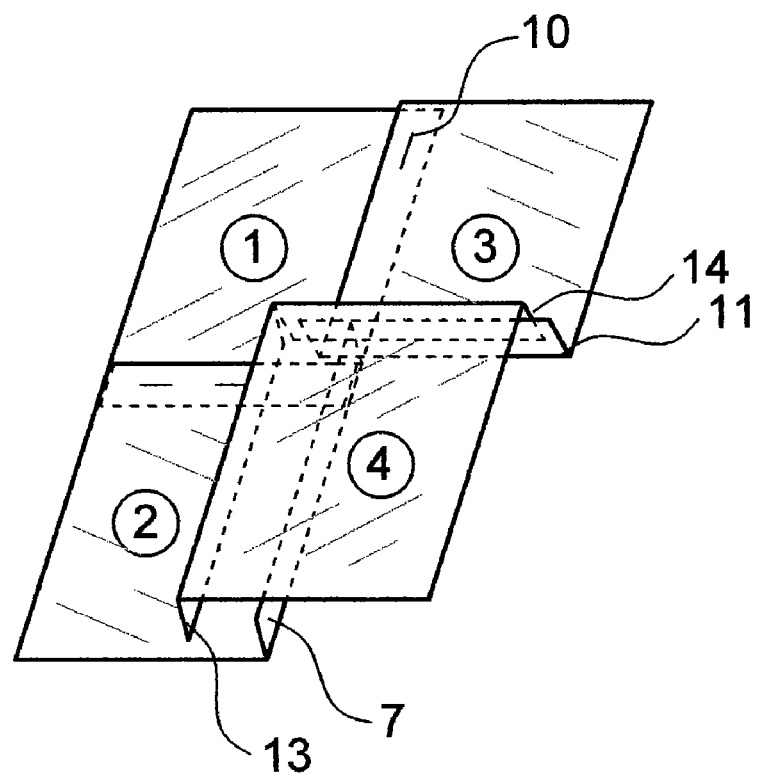

6, the folds 12 and 5 are folded by another 90° respectively, so they are folded by 180° relative to the base material and interlock like hooks in a cross section view. This area of the overlapping folds 5 and 12 with the base material of the mesh sections 1 and 2 above and below is fixed in the same manner as before by staples 10, one of which is shown in FIG. 7 as an example. It is understood that the number and the location of the staples must be selected in a way that a tight and well-conducting connection is established over the whole area of the overlapping area.

Subsequently, a fourth mesh section 4 is cut out in the perimeter area 19 between its longitudinal side (c) and its lateral side (d). Thereafter, the perimeter at the longitudinal side (c) is folded downward by 90° into a fold 13, and on the other hand the perimeter of the lateral side (d) is also folded downward by 90° into a fold 14. The assembly (FIG. 7) is lifted over the three already connected mesh sections 1-3, whose folds 11 and 7 protrude upward, wherein the folds 14 and 11 and the folds 7 and 13 abut each other, wherein the downward protruding front edge of the fold 14 abuts the top side of the mesh section 3 and wherein the upward protruding front edge of the fold 11 abuts the bottom of the mesh section 4. The folds 7 and 13 are arranged in an analogous manner.

Figure 9:
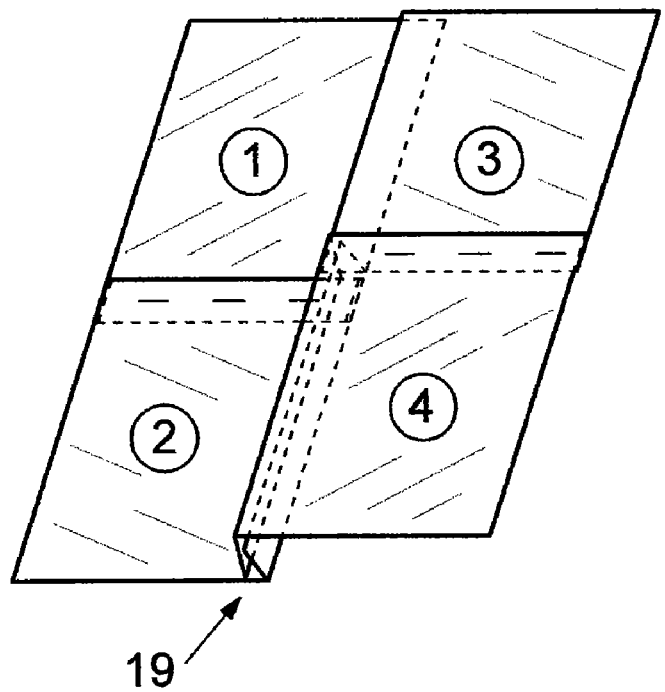
Figure 10:
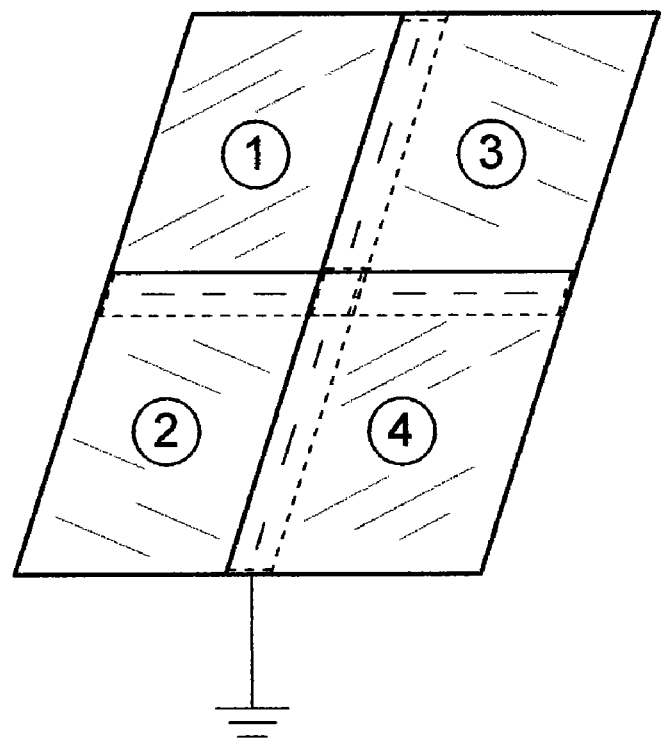

The folds 11 and 14 are then folded by another 90° so they interlock like hooks in a cross section view. Thereafter, staples 10 are applied in this area also, fixing the fold connection (FIG. 9). Finally, the folds 7 and 13, which are still vertical, but already reach over each other, are folded by another 90°, so they are folded by 180° and then fixed with staples 10 in this position, creating the planar assembly, shown in FIG. 10, made from a total of four mesh sections 1-4.

In the above described manner an unlimited number of mesh sections can be connected among each other. As shown in the drawings, all mesh sections are provided with a fold folded 90° upward on their longitudinal sides (a) and with a fold folded downward on their lateral sides (c). In addition the upper lateral side (d) always has a downward folded fold and the lower lateral side (b) always has an upward folded fold. The 90° folding, as described above, can already be performed before the assembly process.

The described material provides high flexibility on the one hand, whereby mesh sections already mounted to the wall, the ceiling, or to the ground, can be lifted up in their perimeter areas. On the other hand, good flexibility is provided, so the last folding process, the folding from 90° to 180° can be performed by hand without the need for special tools. The plastic deformation is simply performed through folding by hand.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. An electromagnetic shield for a room or for a building, the shield comprising overlapping, conductively connected and electrically conductive mesh or grid sections, which are electrically grounded, each of the mesh or grid sections having an overall length along a first axis and an overall width along a second axis that is orthogonal to the first axis, wherein at least one mesh or grid section includes a longitudinal fold having a first dimension along the first axis and a second dimension along the second axis and a lateral fold having a first dimension along the first axis and a second dimension along the second axis, the first dimension of the longitudinal fold being less than the overall length by at least the first dimension of the lateral fold and the second dimension of the lateral fold being less than the overall width by at least the second dimension of the longitudinal fold, and wherein the at least one mesh or grid section overlaps at least one adjacent mesh or grid section along the longitudinal fold and at least one other adjacent mesh or grid section along the lateral fold, such that the folds of the at least one mesh or grid section and adjacent mesh or grid sections interlock like hooks in a cross sectional view.

2. The electromagnetic shield according to claim 1, wherein the mesh or grid sections surround the room to be shielded, or the building to be shielded entirely from all sides.

3. The electromagnetic shield according to claim 1, wherein the mesh or grid sections comprise metal.

4. The electromagnetic shield according to claim 3, wherein the metal is selected from the group consisting of stainless steel, copper and copper alloy.

5. The electromagnetic shield according to claim 1, wherein the mesh or grid sections have a mesh size between 0.1 mm and 1 mm.

6. The electromagnetic shield according to claim 1, wherein the mesh or grid sections comprise wires having a wire diameter between 0.05 mm and 0.5 mm.

7. The electromagnetic shield according to claim 1, wherein the mesh or grid sections comprise copper wire with a diameter between 0.13 mm and 0.15 mm and a mesh size between 0.35 mm and 0.40 mm.

8. The electromagnetic shield according to claim 1, wherein the mesh or grid sections are adapted for an area of a foundation of the building and comprise copper wire with a diameter of up to 5 mm and with a mesh size of up to 1 cm.

9. The electromagnetic shield according to claim 1, wherein the at least one mesh or grid section and adjacent mesh or grid sections are mechanically connected in the overlapping areas.

10. The electromagnetic shield according to claim 9, wherein the at least one mesh or grid section and adjacent mesh or grid sections are mechanically connected in an area of the interlocking folds.

11. The electromagnetic shield according to claim 1, wherein the at least one mesh or grid section and adjacent mesh or grid sections are connected by metal staples in the overlapping areas, in a compressing and interlocking manner.

12. The electromagnetic shield according to claim 11, wherein the at least one mesh or grid section and adjacent mesh or grid sections are connected by the staples in an area of the interlocking folds.

13. The electromagnetic shield according to claim 1, wherein the connected mesh or grid sections are attached to an inside or to an outside of a wall, ceiling, or floor through a pervasive layer of finish, putty, screed or bitumen.

14. The electromagnetic shield according to claim 1, wherein the mesh or grid sections are attached to an outside of a wall or ceiling and are covered with a heat insulation layer, the heat insulation layer being attached to the wall with plastic anchors reaching through the shield.

* * * * *